United States Patent [19]

Leupold

[11] Patent Number: 4,810,986

[45] Date of Patent: Mar. 7, 1989

[54] LOCAL PRESERVATION OF INFINITE, UNIFORM MAGNETIZATION FIELD CONFIGURATION UNDER SOURCE TRUNCATION

[75] Inventor: Herbert A. Leupold, Eatontown, N.J.

[73] Assignee: The United States of America as represented by the Secretary of the Army, Washington, D.C.

[21] Appl. No.: 160,952

[22] Filed: Feb. 26, 1988

[51] Int. Cl.$^4$ ............................................. H01F 7/00
[52] U.S. Cl. ................................... 335/301; 335/304
[58] Field of Search ............... 335/301, 302, 303, 304, 335/306

[56] References Cited

U.S. PATENT DOCUMENTS

| | | | |
|---|---|---|---|
| 3,205,415 | 9/1965 | Seki et al. | 335/301 X |
| 3,227,931 | 1/1966 | Adler | 335/304 |
| 3,768,054 | 10/1973 | Neugebauer | 335/304 |
| 4,222,021 | 9/1980 | Bunker | 335/303 X |
| 4,549,155 | 10/1985 | Halbach | 335/304 X |
| 4,647,887 | 3/1987 | Leupold | 335/211 |
| 4,654,618 | 3/1987 | Leupold | 335/304 |
| 4,658,228 | 4/1987 | Leupold | 335/211 |
| 4,692,732 | 9/1987 | Leupold et al. | 335/302 |
| 4,701,737 | 10/1987 | Leupold | 335/301 |
| 4,706,057 | 11/1987 | Schwab | 335/304 X |

OTHER PUBLICATIONS

"Permanent Magnets for Production and Use at High Energy Particle Beams" by Klaus Halbach, pp. 123–136.

*Primary Examiner*—George Harris
*Attorney, Agent, or Firm*—Sheldon Kanars; John K. Mullarney

[57] ABSTRACT

Truncated clad magnetic structures producing a strong magnetic field within an interior working space and having minimal external flux leakage. Cladding magnets are added to structures which otherwise must be theoretically infinite. The cladding magnets, specially shaped so that their exterior surfaces are at zero magnetomotive potential, permit the use of truncated structures without loss of field strength or uniformity. Cladding formulas give approximate values which can be made more nearly exact by successive approximations in cladding thickness variations.

3 Claims, 1 Drawing Sheet

LOCAL PRESERVATION OF INFINITE, UNIFORM MAGNETIZATION FIELD CONFIGURATION UNDER SOURCE TRUNCATION

The invention described herein may be used, manufactured, and licensed by or for the Government for governmental purposes without the payment of any royalties thereon or therefor.

TECHNICAL FIELD

This invention relates generally to the field of magnetic structures or circuits for electronic devices and more specifically to magnetic circuits which include magnetic cladding to preferentially confine and direct magnetic flux.

BACKGROUND OF THE INVENTION

Various electronic devices such as klystrons, traveling wave tubes and other microwave devices require controlled uniform magnetic fields. The advent of rare earth-cobalt permanent magnets makes it possible to create many novel magnetic structures that were formally not practicable. The desirable properties of rare earth-cobalt permanent magnets stem from their high saturation magnetization and high coercivity. A high saturation magnetization provides a magnetic field source of high flux density; a high coercivity enables the magnet to maintain its flux density in the face of very high demagnetizing fields. Thus, rare earth-cobalt permanent magnets can with impunity be fashioned in shapes that would cause demagnetization of conventional magnetic materials such as alnico.

Analysis of magnetic circuits is often facilitated by comparing them with well-known dc electrical circuits. In this scheme, the roles of electric current I, electric force V, electric conductance G, and resistance R, are assumed respectively, by the magnetic flux $\phi$, the magnetomotive force F, the magnetic permeance P, and the reluctance $\mathcal{R}$. In this analogy, permanent magnets may be viewed as "magnetic batteries"; materials of high permeability, such as soft iron or permalloy may be viewed as essentially perfect flux conductors; and air gaps or materials of low permeability as "magnetic resistors". Unlike alnico magnets, rare earth-cobalt magnets are well suited to the above analogy, because they generate a magnetomotive force which is independent of the circuit into which they are inserted (similar to a battery). By contrast, the magnetomotive force provided by an alnico magnet is affected by the particular magnetic circuit into which it is inserted.

Those concerned with the development of magnetic devices have long recognized the need for improving the magnetic flux density per unit weight of magnetic circuits, thereby improving the overall size and cost of such devices. Various prior art devices have used magnetic cladding to reduce flux leakage exterior to the circuit and increase the desired controlled magnetic field intensity in the working space interior to the circuit without appreciably increasing the total size or weight of the magnetic circuit. In accord with the electrical analogy mentioned above, reduction of current in a branch of an electrical circuit may be effected either by increasing the resistance in that branch or by inserting a source of electromotive force in opposition to the unwanted current. The use of magnetic cladding in magnetic circuits corresponds to setting up a magnetomotive force to counter undesired flux flow external to the circuit working space. The cladding magnets provide a "bucking" magnetomotive force which prevents flux "flow" (akin to current flow) where it is not wanted by the designer. In other words, flux is confined (or prevented from leaking out) by making the entire outer surface of a magnetic circuit an equipotential surface so that no flux lines can stream between different points on it.

Two magnetic structures of particular importance to this invention are the magic ring and a cladded rectangular structure. One embodiment of the magic ring is disclosed in: K. Halbach, proceedings of the 8th International Conference on Rare Earth Magnetic Materials (University of Dayton, Dayton Ohio, 1985), p. 123. The cladded rectangular structure is disclosed in: applicant's copending U.S. patent application entitled "Permanent Magnet Structure for a Nuclear Magnetic Resonance Imager for Medical Diagnostics, Ser. No. 112,192 filed Oct. 20, 1987 which is hereby incorporated by reference.

The ideal magic ring is an infinitely long, annular cylindrical shell which produces an intense magnetic field in its interior working space. The direction of the magnetic field in the working space interior is perpendicular to the long axis of the cylinder. The Halbach publication discloses a structure with an octagonal cross section which closely approximates the performance and field configuration of an ideal magic ring. In both the ideal and Halbach configurations, no magnetic flux extends to the exterior of the ring structure.

The cladded rectangular structure of the above-mentioned copending application is also (theoretically) infinitely long in one dimension. The structure produces a strong uniform magnetic field within a rectangular working space. The direction of the magnetic field is perpendicular to the long dimension of the structure. The structure has primary external cladding magnets which prevent flux from escaping to the exterior of the structure.

Unfortunately, both the magic ring and cladded rectangular structure of the above-mentioned copending application are theoretically infinitely long. Thus, achievement of the desirable high uniform magnetic fields in the interiors of both of these structures demands that both structures be made extremely long (theoretically infinite). If either structure is not long enough, distortion of the interior fields will result.

Those concerned with the development of magnetic devices have long recognized the need for improving the magnetic density per unit weight of magnetic circuits and thereby improving the overall size and cost of such devices. Thus, there is a need to fabricate both a magic ring and a cladded rectangular magnetic structure with reduced cost, weight and size.

SUMMARY OF THE INVENTION

It is therefore an object of this invention to provide an improved magnet structure wherein leakage flux is minimized.

It is another object of this invention to provide a magnet construction having an improved magnetic intensity per unit weight ratio.

It is a further object of this invention to provide a truncated magic ring structure with no external flux leakage.

It is additionally an object of this invention to provide a truncated cladded rectangular structure with minimal external flux leakage.

To achieve the foregoing objects, cladding magnets are added to a truncated magic ring structure and additional or secondary cladding magnets are applied to a truncated cladded rectangular structure such as that disclosed by applicant's aforementioned copending application. The aforementioned cladding magnets are uniquely shaped so that their exterior surfaces are at a constant magnetic potential, thus preventing flux leakage from the ends of the truncated structures and intensifying the magnetic fields interior to the aforementioned structures.

BRIEF DESCRIPTION OF THE DRAWINGS

Further objects and advantages of the present invention will become apparent to those familiar with the art upon examination of the following detailed description and accompanying drawings in which.

DETAILED DESCRIPTION OF THE PREFERRED EMBODIMENTS

Figure 1:
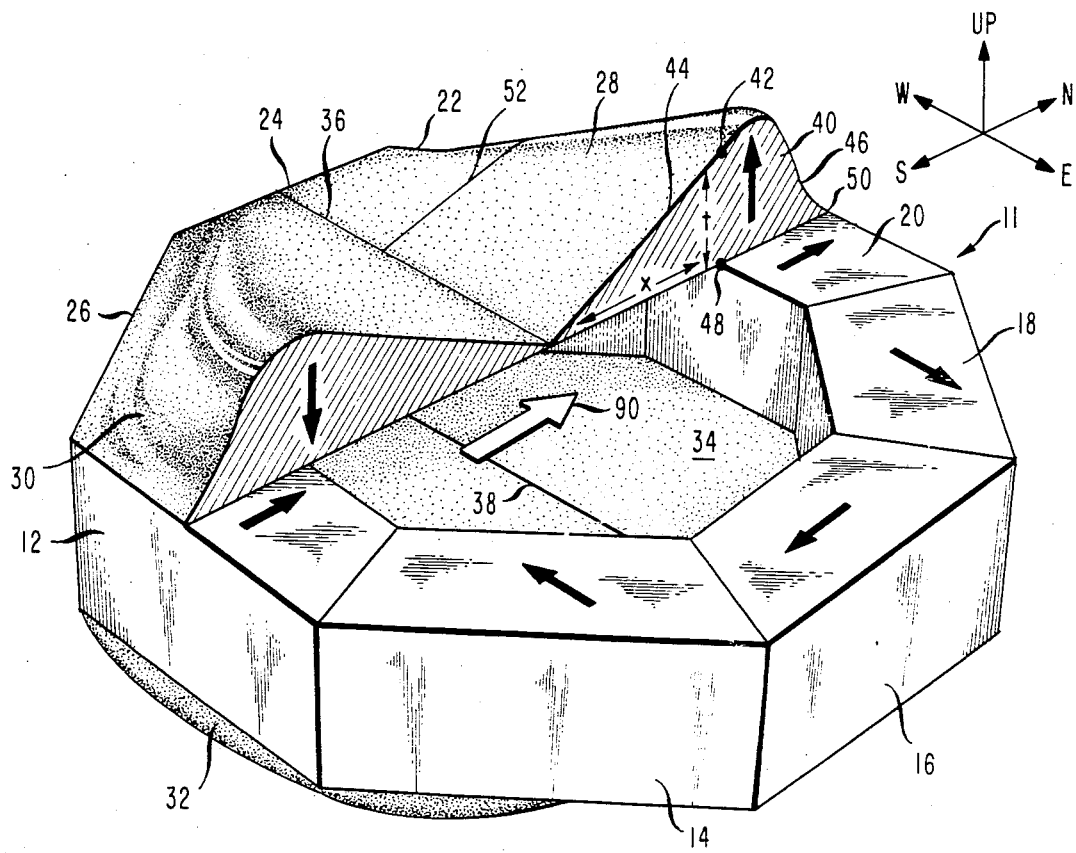
FIG. 1 is a perspective view of a truncated octagonal magic ring with upper and lower cladding magnets according to the present invention.

In FIG. 1, the inventive device is designated generally by reference numeral 11. Magnet segments 12, 14, 16, 18, 20, 22, 24, and 26 form a truncated octagonal structure which approximates a truncated magic ring. The segments are made from rare earth cobalt magnetic material. If the magic ring formed by the aforementioned eight segments were infinitely high, the magnetic field designated by arrow 90 in the interior of the magic ring would be precisely uniform within the interior. However, because each of the segments 12-26 has a finite height, there is considerable distortion of the magnetic fields in the interior. However, use of the magic ring in various electronic devices demands that the height of the magic ring be limited.

Each of the magic ring segments 12-26 has a unique magnetic orientation or magnetization, M. For convenience, segments 12 and 20 will be referred to as magnetically oriented in a northerly direction. Thus, in the figure, segments 12 and 20 have arrows pointing in a northerly direction. Segments 16 and 24 are oriented in a southerly direction. Segments 18 and 26 are oriented in an easterly direction, while segments 14 and 22 are oriented in a westerly direction. (The aforementioned compass directions serve merely to provide a convenient frame of reference and should not be confused with magnetic north and south poles).

As mentioned before, since the magic ring is truncated, the field inside the magic ring is not uniform. There is also flux leakage from the interior to the exterior of the ring. However, the addition of cladding magnets 28, 30, 32 and 34 to the top and bottom of the magic ring structure will serve to prevent magnetic flux from escaping from the interior of the structure and to create a strong uniform magnetic field in the interior. The following will explain how the shapes of cladding magnets 28, 30, 32 and 34 are determined.

Lines 36 and 38 are chosen as zero references for magnetic potential. It should be noted that the plane determined by lines 36 and 38 is perpendicular to the net magnetic field, indicated by arrow 90, within the structure 11. (Thus, an equipotential plane has been identified as being perpendicular to a field line—in accord with electrostatic and magnetostatic theory). In theory, lines 36 and 38 indicate where cladding magnets 28-34 have zero height above the magic ring. In practice, lines 36 and 38 indicate the meeting of knife-edges (of virtually zero thickness) on magnet pairs 28-30 and 32-34 respectively.

The shape of cladding magnet 28 will now be discussed. The shapes of cladding magnets 30, 32 and 34 are identical to the shape of cladding magnets 28, although their magnetic orientations, M, differ as will be explained further below. Examining cross section 40 of magnet 28, it is seen that the height of magnet 28 increases in a generally linear fashion from knife-edge 36 towards an apex 42 and then decreases along contour line 46. Calculation of the shape of curves 44 and 46 determines the shape of cross sectional area 40.

Calculation of the shape of curves 44 and 46 is performed by requiring that these two curves be lines of zero magnetic potential.

It is assumed that the magnetic field strength, $H_w$ represented by arrow 90 within the working space of the magic ring is known. Design procedures known to those skilled in the art permit one to calculate the magnetic field strength within the interior of a magic ring when the inner and outer radii of the ring are known, together with the remanence, $B_r$, of the magnetic material comprising the ring. For example, for an ideal, infinitely high magic ring, the magnetic field strength is given by:

$$H_w = B_r \ln(r_2/r_1) \qquad (1)$$

where $r_2$ = outer radius of ring $r_1$ = inner radius of ring $B_r$ = remanance of ring material.

Of course, the truncated magic ring illustrated in FIG. 1 has an octagonal cross section and so the above ideal formula does not give an entirely correct result. However, it is a useful approximation.

A more accurate value for H may be obtained by computer simulations well known to those skilled in the art.

The height, t of any point at abscissa, X, along curves 44 and 46 of FIG. 1 may be calculated from the formula:

$$\int_0^X H_w dx = H_c t \qquad (2)$$

ps where $H_c$ = coercivity of cladding magnet material when $H_w$ is uniform, the above formula reduces to:

$$H_w X = H_c t \qquad (3)$$ ps or $$t = (H_w/H_c)X \qquad (4)$$

It will be noted from an examination of FIG. 1, that the height, t, increases gradually as one proceeds northward from knife-edge 36. The height increases until point 42 which is directly above point 48 is reached. Point 48 is the point at which cladding magnet 28 touches magnet segment 20. At point 48, the line integral in equation 2 above changes sign because H, the magnetic field strength within the interior of magnetic segment 20, changes direction and points southward. The H fields in the magnet segment 20 must be obtained to complete the calculation from point 42 northward. The field $H_{mag}$ in the magnet obtained from:

$$H_{mag} = B_{mag} - B_r \qquad (5)$$

where $B_{mag}$ is the flux density in the magnet segment 20 and $B_r$ is the remanence of the segment material.

The height, t, of cladding magnet 28 decreases to zero at point 50 which is the outside edge of magnet segment 20. Cladding magnet 28 need not protrude beyond point 50 because no flu escapes from the interior, of the magic ring. The height of many other cross sections of cladding magnets 28, for example, a cross section designated by line 52, may be calculated in the same way. Thus, the shape of the entire exterior contour of magnet 28 may be calculated by successive calculation of cross sections. The procedure is best done via computer. When a sufficient number of of cross sections has been calculated, a satisfactory approximation to the ideal exterior contour is obtained.

The orientation of the magnetization of cladding magnet 28 is upward. The magnetic orientation of cladding magnet 30 is downward. The orientation of cladding magnet 32 is upward. The orientation of cladding magnet 34 is downward. The four magnets 28, 30, 32 and 34 all have the same shape. Magnets 28 and 32 have the same upward magnetization while magnets 30 and 34 have the same downward magnetization.

Thus, addition of cladding magnets 28, 30, 32, and 34 to the truncated magic ring of FIG. 1 permits achievement of a uniform high strength magnetic field within the interior of a truncated magic ring. The resulting design, resembling a small box or pyx is less bulky and costly than a long cylinder. The device of FIG. 1 may be applied to traveling wave tubes, for example, by cutting a small entrance hole through magnet segment 12 and a small exit hole through magnet segment 20. An electron beam may be made to traverse the working space under the influence of the strong, uniform magnetic field 90.

The individual magnets 28, 30, 32, and 34 may be individually machined from rare earth cobalt materials and subsequently magnetized. Alternatively, if desired, a series of individual magnets, which, taken together, have the same external contour as magnets 28, 30, 32, or 34, may be employed.

The cladded rectangular structure of the aforementioned copending application will now be described. After the basic cladded structure of the prior copending application is described, the design of secondary cladding magnets which permit the use of a truncated structure will be described. The secondary cladding magnets will perform a function akin to that performed by magnets 28–34 of FIG. 1.

Referring to FIG. 2, it is again convenient to use a compass-like coordinate system to facilitate the description of magnetic orientations. All of the magnets described herein are rare earth cobalt magnets. Magnets 113 and 114 are flat rectangular plates of theoretically infinite extent in the east-west planes. Pole-piece 116, made from "soft" ferro-magnetic material, such as iron, is positioned abutting the north ends of permanent magnets 113 and 114. Another pole piece not shown in the figure abuts the southern ends of magnets 113 and 114. The magnetization, M, of magnet 113 is oriented in a southerly direction, while the magnetization, M, of magnet 114 is also oriented in a southerly direction. The structure comprising magnets 113 and 114 together with pole-piece 116 and a similar un-illustrated pole-piece produces an intense magnetic field oriented in a northerly direction, indicated by arrow 120 within the working space 121 between magnets 113 and 114.

If magnets 113 and 114 were both of infinite extent in the east-west direction, the magnetic field 120 would be very uniform in working space 121. As disclosed in the prior, aforementioned copending application, the device 111 is improved by the addition of primary cladding magnets which serve to confine magnetic flux which otherwise would escape from the exterior surfaces of magnets 113, 114 and the two pole-pieces.

The flux density 120 in the working space 121 is increased and the flux is prevented from escaping from the working space by cladding magnets 119, 115, 124, 117, and 118. Cladding magnet 119 has an upward directed magnetization. Cladding magnet 124 has a downward directed magnetization. Cladding magnet 115 has a magnetization directed in a northerly direction. Cladding magnet 118 has a magnetization directed upwards in a northerly direction; while cladding magnet 117 has a magnetization directed downward in a northerly direction. Similar primary cladding magnets such as magnets 122 and 123, oriented respectively in the upward and upward-south directions, perform the same functions on the left half of the structure as the magnets just described.

Thus, what has so far been described is a rectangularly clad magnet structure with a relatively uniform magnetic field within its interior working space. A practical example of the aforedescribed structure with magnet weights and field strengths is given in the aforementioned copending application. Of course, it is impossible for the aforedescribed structure to have an infinite extent in the east-west plane. The addition of secondary cladding magnets, to be described below, permits the use of the truncated structure illustrated in FIG. 2, while preventing the escape of magnetic flux from the interior working space.

In the structure described thus far, it should be noted that line 129 represents the meeting of knife edges of cladding magnets 122 and 119. Line 129 is, therefore, a zero magnetic potential reference. In order to determine the thickness and shape of the secondary cladding magnets, line 129 is extended to line 130. Thus, line 130 also represents the meeting of knife edges of secondary cladding magnets and a zero magnetic potential reference.

Turning now to the construction of secondary cladding magnet 125, its dimensions may be calculated in accord with the previously given formulas. Specifically, cladding magnet 125 has a knife edge at line 130 and increases in thickness at the easterly direction with southward progression from line 130. The thickness (corresponding to "height" of the cladding magnets in the magic ring example) can be calculated from equations 2 and 3, given the field, H in the working space and the coercivities of the magnets. The thickness of cladding magnet 125 reaches its maximum along line 131 which is opposite the interface between the pole-piece and end exterior cladding magnet (corresponding to pole-piece 116 and cladding magnet 115 on the right hand side). The calculation will give a uniform value for the magnetization of the cladding magnets, if a uniform value for the $H_w$ is used. However, computer-generated maps of the magnetic field strength in the interior of structure 111 show that $H_w$ is not perfectly uniform but may vary by a few percent. Use of the precise formula given in equation 2 will either yield cladding magnet shapes that differ slightly from the ideal shapes discussed here or will yield magnets with slightly non-uniform magnetizations. Either design approach is satisfactory if a more uniform working space field is desired. Two additional cladding magnets 127 and 126 are shaped generally like quarter-cones. The quarter-cone cladding magnets 127 and 126 are diagonally magnetized. The main cladding magnet 125 is magnetized in a westerly direction.

A total of four cladding magnets configured similar to cladding magnet 125 are placed symmetrically around the structure. A total of eight quarter-coned shaped, diagonally magnetized, cladding magnets similar to 126 and 127 are also symmetrically placed around the structure. The figure illustrates two additional quarter-cone cladding magnets 132 and 133. Magnets 127 and 126 are magnetized respectively in the downward-westerly direction and upward-westerly direction respectively. There is also a total of eight corner magnets which are shaped like one-eigth spheres. Some of them are designated by reference numerals 201, 202, 203 and 204. Magnets 201, 202, and 203 are magnetized diagonally pointing inward to the structure 111. For example, magnet 201 is magnetized in a downward northwesterly direction; magnet 202 is magnetized in a upward northeasterly direction, etc.

The cladding magnets on the right half of the structure 111 (most of which have been removed for clarity), are magnetized in directions outward from the interior of the structure 111. For example, the main cladding magnet which is adjacent magnet 125 is magnetized in an easterly direction. The quarter-cone magnets above and below it are magnetized in an upward-easterly direction and a downward easterly direction. The adjacent ⅛ spherical magnets are magnetized in the upward southeasterly direction and downward south easterly direction.

Figure 2:
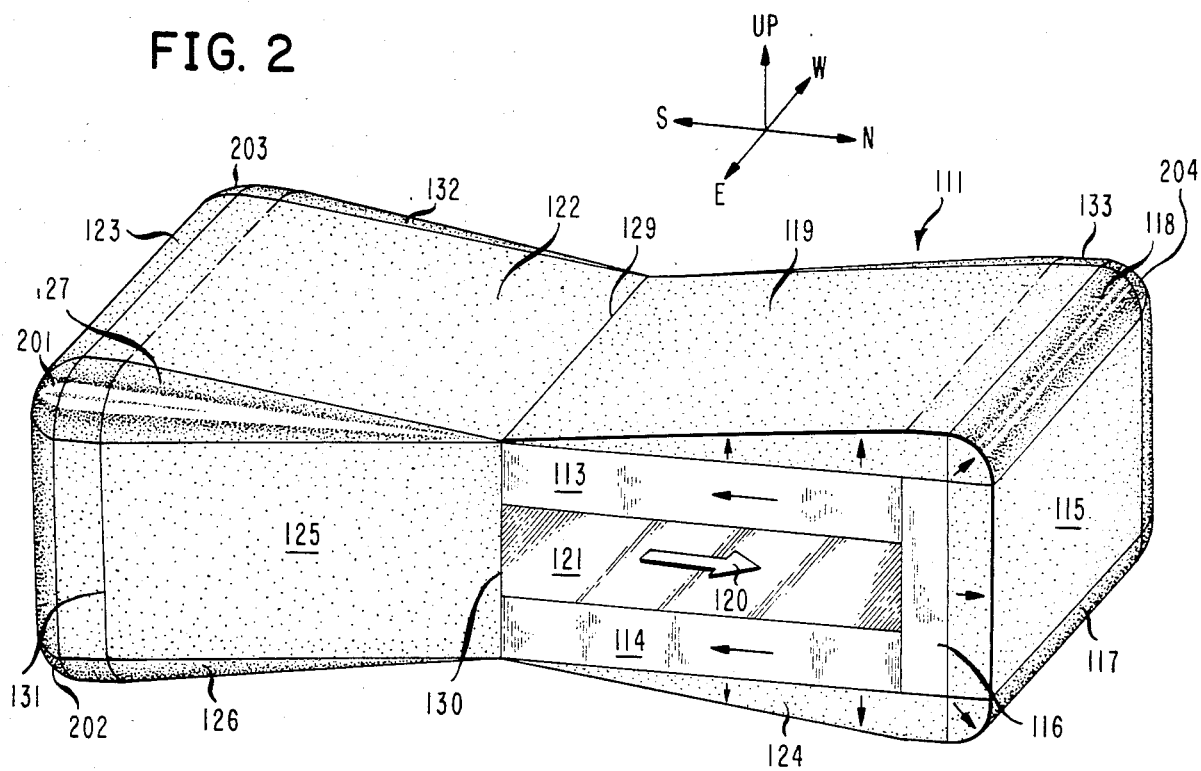
FIG. 2 is a perspective view of a cladded rectangular structure with secondary cladding magnets applied to the front and back thereof.

The resulting closed structure resembles a rectangular pyx. The following numerical example will make application of the foregoing principles clearer. The following assumptions are made: (1) there is 6,400 G in an air working space of 3.4 cm³; (2) all of the cladding magnets carry no flux of their own; (3) all magnets are rare earth-cobalt type with $H_c = B_r = 10,000G$ and density equals 8.3 grams per cubic centimeter; (4) the field is constant over the area of the air gap; (5) a plane of zero magnetomotive force bisects the structure—the plane is defined by lines 129 and 130. In the structure of FIG. 2, the field traverses a length of 1.7 centimeters and the width of the structure normal to the field is 2.0 cm. The two supply magnets 113 and 114 must supply flux of $$\phi = (1 \text{ cm} \times 2.0 \text{ cm})(6.4 \text{ kOe}) = 12.8 \text{ Mx} \tag{6}$$

which gives a total supply magnet thickness of about 1.778 centimeters for each magnet. The thickness of the cladding magnet 115 (and its non-illustrated counterpart on the left hand side of the figure) is 0.544 centimeters. Similarly, the maximum thickness of external cladding magnets 119, 124 and 122 (together with the non-illustrated cladding magnet beneath magnet 122) is also 0.544 centimeters. Lastly, the pole pieces 116 (and its non-illustrated counterpart on the left hand side of the figure) must have a thickness of 0.32 centimeters to prevent saturation. If the thickness of the figure measured in the east-west direction is 1 centimeter, the total mass is approximately 151 grams.

Turning now to the secondary cladding magnets, such as magnets 125, 126 and 127. Secondary cladding magnets are oriented in such a manner and are of a thickness so as to provide an equal and opposite magnetomotive force to the supply magnets at every point on their surface. In this way, the infinite extent in the east-west plane of the basic structure can be imitated. The maximum thickness of the surface cladding magnet 125 and its three counterparts is:

$$t = (6.4 \text{kOe} \times 1.7 \text{ cm})/(2 \times 10 \text{kG}) = 0.544 \text{ cm} \tag{7}$$

where the H field in the supply magnets is taken to be the same as the H field in the working space. In summing up the mass of the surface cladding, one obtains 58 grams. Consequently, a fully clad rectangular structure in this example weighs approximately 209 grams. Of course, in an actual device, holes must be bored to allow ingress and egress from the working space.

In conclusion, considering both the magic ring and the cladded rectangular structure, it should be noted that ideally both designs are of infinite extent in one dimension. The use of the cladding magnets described herein permits the truncation of both structures to manageable size while preserving the strength of the magnetic field within the working space and preventing undue leakage of magnetic flux. In both cases, the magnetic field within the working space is perpendicular to the axis of ideally infinite extent of the structure. The shape (i.e. height or thickness) of the cladding magnetic is determined in each case by requiring that the outer surface of the cladding magnets be at zero magnetic potential with respect to a selected datum.

While the invention has been described with respect to specific embodiments, it should be understood that other variations may be made in the particular designs and configurations without departing from the scope of the invention as set forth in the appended claims.

What is claimed is:

1. A magnetic construction comprising a truncated hollow cylinder of polygonal cross-section, said truncated hollow cylinder being formed of rare earth magnetic material and producing a high uniform magnetic field with the interior of the same, said cylinder having flat parallel end faces perpendicular to the axis of said cylinder, cladding magnets abutting an end face and covering said interior at one end of said cylinder, and cladding magnets abutting the other end face and covering said interior at the other end of said cylinder, said cladding magnets having a cross-section which varies from a knife edge at an axial plane of zero magnetic potential to an intermediate thick portion and then to a knife edge at the outer edges of said end faces, said cladding magnets having a direction of magnetization perpendicular to said interior magnetic field with a magnetization strength equivalent to that of the magnetic material forming the truncated hollow cylinder.

2. A magnetic construction as defined in claim 1 comprising a pair of cladding magnets covering each end face of said truncated hollow cylinder, said hollow cylinder having octagonal inner and outer surfaces.

3. A magnetic construction as defined in claim 2 wherein the height t of each of the cladding magnet exterior surfaces, measured from a plane defined by the adjacent end face, being given by the equation:

$$t = \int_0^X \frac{H}{H_c} dt$$

where t is said height;

$H_c$ is the coercivity of the rare earth permanent magnet material;

X is the absicca at which height t is calculated, measured from said plane of zero magnetic potential; and H is the magnetic field in the X direction.

* * * * *